United States Patent [19]

Miyake et al.

[11] Patent Number: 5,394,451
[45] Date of Patent: Feb. 28, 1995

[54] OPTICAL ARRANGEMENT FOR EXPOSURE APPARATUS

[75] Inventors: Akira Miyake; Yutaka Watanabe, both of Isehara, Japan

[73] Assignee: Canon Kabushiki Kaisha, Tokyo, Japan

[21] Appl. No.: 955,433

[22] Filed: Oct. 2, 1992

[30] Foreign Application Priority Data

Oct. 8, 1991 [JP] Japan .................................. 3-289285
Jul. 29, 1992 [JP] Japan .................................. 4-202528

[51] Int. Cl.⁶ .............................................. G21K 5/04
[52] U.S. Cl. .................................. 378/34; 378/84; 378/85
[58] Field of Search ............... 378/34, 35, 84, 85, 378/43

[56] References Cited

U.S. PATENT DOCUMENTS

| | | | |
|---|---|---|---|
| 4,028,547 | 6/1977 | Eisenberger | 378/85 |
| 4,788,698 | 11/1988 | Kimura et al. | 378/34 |
| 5,031,199 | 7/1991 | Cole, III et al. | 378/34 |
| 5,123,036 | 6/1992 | Uno et al. | 378/34 |
| 5,125,014 | 6/1992 | Watanabe et al. | 378/34 |
| 5,150,151 | 9/1992 | Mochizuki et al. | 355/53 |

FOREIGN PATENT DOCUMENTS

WO8908920  9/1989  WIPO .
WO8911683  11/1989  WIPO .

*Primary Examiner*—David P. Porta
*Attorney, Agent, or Firm*—Fitzpatrick, Cella, Harper & Scinto

[57] ABSTRACT

An optical arrangement includes an optical system for transforming synchrotron radiation light emitted from an emission point of a synchrotron ring into a substantially parallel beam, with respect to a first direction which is parallel to an orbit plane of the synchrotron ring and with respect to a second direction which is perpendicular to the orbit plane, wherein an absolute value of a focal length of the optical system in the first direction is smaller than that in the second direction.

10 Claims, 7 Drawing Sheets

OPTICAL ARRANGEMENT FOR EXPOSURE APPARATUS

FIELD OF THE INVENTIONS AND RELATED ART

This invention relates to an optical arrangement suitably usable, for example, in an exposure apparatus such as an X-ray exposure apparatus which uses, as a light source, synchrotron radiation light produced by a charged particle accumulation ring (synchrotron ring).

Figure 8A:
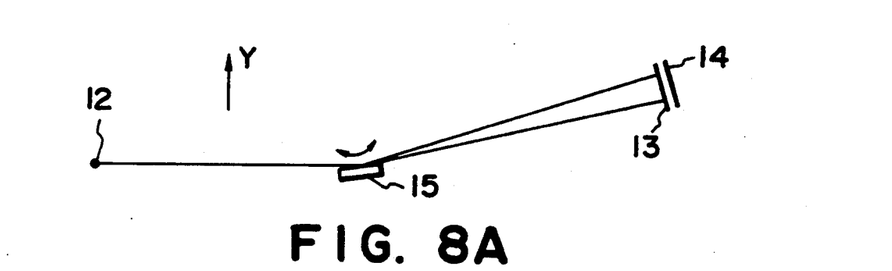
Figure 8B:
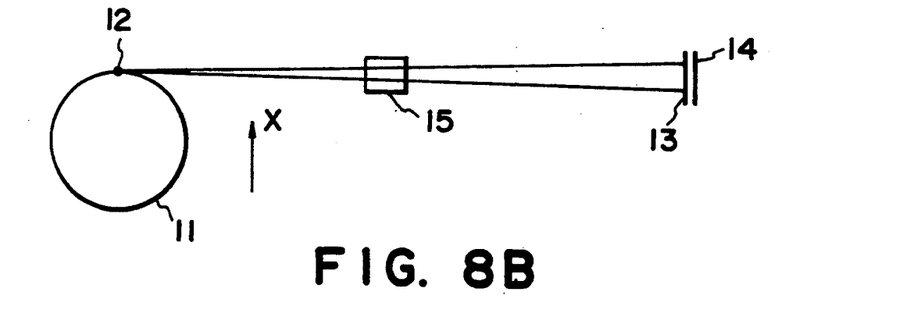

An example of an exposure apparatus, which uses synchrotron radiation light as a light source to transfer a fine mask pattern such as VLSI to a wafer, is illustrated in FIGS. 8A and 8B wherein synchrotron radiation light emitted from an emission point 12 of a synchrotron ring (SOR ring) 11 is reflected by a mirror 15, swinging in the direction of the arrow, and thus it is expanded in a direction (Y direction) perpendicular to the orbit plane of the synchrotron ring 11. The expanded light illuminates a mask (original) 13 whereby a pattern of the mask is transferred to a wafer 14.

In the illustrated example, the distance from the emission point 12 to the mirror 15 is, e.g., 5 m; the distance from the mirror 15 to the mask 13 is, e.g., about 5 m; the distance from the mask 13 to the wafer 14 (i.e. "proximity gap") is, e.g., about 30 microns; and the size of the transfer region is about 20 mm square.

In this example, the acceptance angle (the angle of divergence of light, from a point light source, that can be accepted by an illumination system (mirror 15) for projection of light to a mask and a wafer) with respect to a direction (X direction) parallel to the orbit plane of the synchrotron ring is 2 mrad, and the tilt in the X direction of the synchrotron radiation light impinging on the mask 13 is 1 mrad (max.) while the tilt thereof in the Y direction is 2 mrad (max.). As a result, there occurs distortion (called "run-out error") in the mask pattern transferred to the wafer 14. The magnitude of this distortion in the Y direction is 0.06 micron (max.).

Figure 9A:
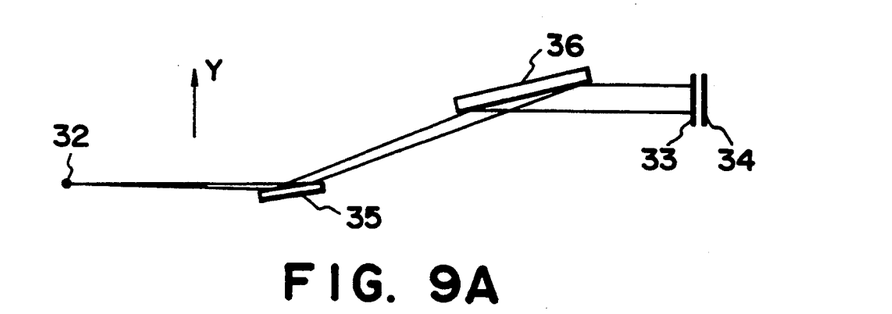
Figure 9B:
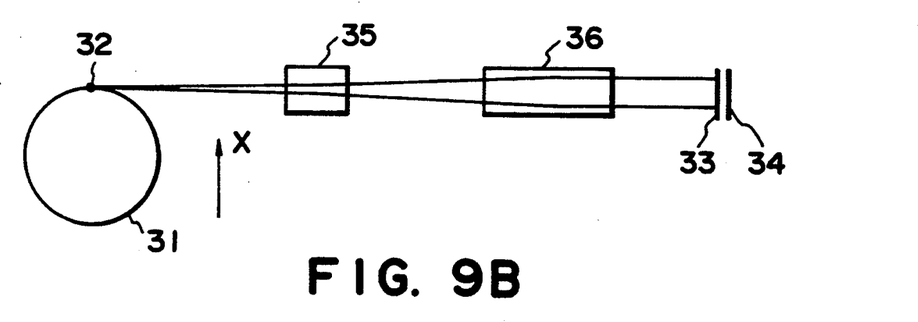

FIGS. 9A and 9B show another example of a radiation exposure apparatus by which the problem of run-out error such as described above may be solved.

In the apparatus of FIGS. 9A and 9B, for transferring a mask pattern of a mask 33 to a wafer 34, a beam emitted from an emission point 32 of a synchrotron ring 31 is reflected by a rotational hyperboloid reflecting mirror 35 and then by a rotational paraboloid reflecting mirror 36, whereby it is collimated with respect to the X and Y directions.

In this structure, however, the system comprising the reflecting mirrors 35 and 36 has the same focal distance in the X and Y directions and, therefore, the angle of acceptance of the synchrotron radiation is the same with respect to both the X and Y directions.

However, since the synchrotron radiation light has a larger divergence angle in the X direction than that in the Y direction, with this system, it is only possible to retrieve or accept a very small portion of the light in the X direction. Namely, most of the light emitted from the synchrotron is not used and, naturally, the efficiency of using synchrotron radiation light is low. This consequently requires a prolonged exposure time.

SUMMARY OF THE INVENTION

It is accordingly an object of the present invention to provide an optical arrangement by which synchrotron radiation light can be collimated in the X and Y directions and, additionally, by which the angle of acceptance of the synchrotron radiation light with respect to the X and Y directions can be enlarged.

It is another object of the present invention to provide an improved semiconductor device manufacturing method which uses the optical arrangement described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B show a first embodiment of the present invention, wherein FIG. 1A is a side view and FIG. 1B is a plan view.

FIGS. 2A and 2B show a second embodiment of the present invention, wherein FIG. 2A is a side view and FIG. 2B is a plan view.

FIGS. 3A and 3B show a third embodiment of the present invention, wherein FIG. 3A is a side view and FIG. 3B is a plan view.

FIGS. 8A and 8B show a known example of an X-ray exposure apparatus, wherein FIG. 8A is a side view and FIG. 8B is a plan view.

FIGS. 9A and 9B show another known example of an X-ray exposure apparatus, wherein FIG. 9A is a side view and FIG. 9B is a plan view.

DESCRIPTION OF THE PREFERRED EMBODIMENTS

Preferred embodiments of the present invention will now be explained in conjunction with the drawings.

Figure 1A:
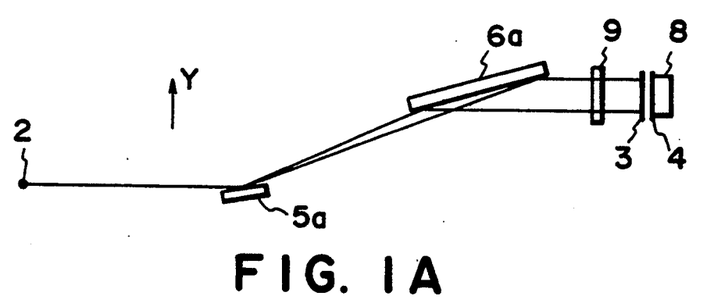
Figure 1B:
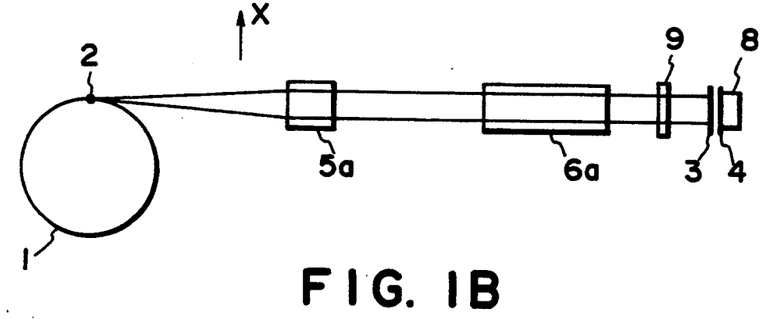

Referring first to FIGS. 1A and 1B showing the first embodiment of the present invention, synchrotron radiation light produced by a synchrotron ring (SOR ring) 1 emanates from an emission point 2. The emitted radiation light is collected and collimated by a first mirror 5a and a second mirror 6a. Denoted at 9 is an exposure shutter for adjusting the amount of exposure. The radiation light then illuminates a mask (original) 3 by which the mask pattern is transferred to a resist applied to a wafer (substrate) 4. The wafer 4 can be displaced by a stage 8, for adjustment of the relative positional relationship between the mask 3 and the wafer 4.

Here, each of the first and second mirrors 5a and 6a has formed on its reflection surface a multilayered film or a single-layer film, comprising SiC or Pt. The first mirror 5a has a toroidal shape of curvature, concave in the X direction and convex in the Y direction. The second mirror 6a has a cylindrical shape of curvature, infinite in the X direction and concave in the Y direction.

The synchrotron radiation light is reflected by the first mirror 5a, by which it is collected with respect to the X direction. Thus, it is retrieved or accepted with a large angle and is collimated. Then, the synchrotron radiation light is reflected by the second mirror 6a, by which it is collimated with respect to the Y direction. The thus collimated synchrotron radiation light illuminates the mask 3, for transferring the mask pattern (circuit pattern) to the wafer 4.

Table 1 below shows specifications of the first and second mirrors.

TABLE 1

| MIRROR | X DIRECTION | | Y DIRECTION | |
|---|---|---|---|---|
| | RADIUS OF CURVATURE | FOCAL LENGTH | RADIUS OF CURVATURE | FOCAL LENGTH |
| 1ST | 0.279 | 4.0 | −9.97 | −0.174 |
| 2ND | INFINITE | INFINITE | 238.4 | 4.167 |

Unit:meter (Primary Incidence Angle: 88 deg.)

In Table 1, each positive curvature radius corresponds to a concave surface while the negative curvature radius corresponds to a convex surface. The distance from the emission point 2 to the first mirror 5a is 4 m; the distance from the first mirror 5a to the second mirror 6a is 4 m; and the primary incidence angle (angle with respect to the normal to the mirror) of the synchrotron radiation light to the mirror is 88 deg., in both cases of the first and second mirrors 5a and 6a. The synthetic focal length is 4 m in the X direction and 100 m in the Y direction.

If the size of the exposure region on the mask is 20 mm square, the angle of acceptance of synchrotron radiation light is 0.29 deg. in the X direction and 0.011 deg. in the Y direction. Namely, in the X direction the light collection is 25 times as much as in the Y direction. As a consequence, the illuminance on the mask increases and it is possible to reduce the exposure time considerably.

Figure 2A:
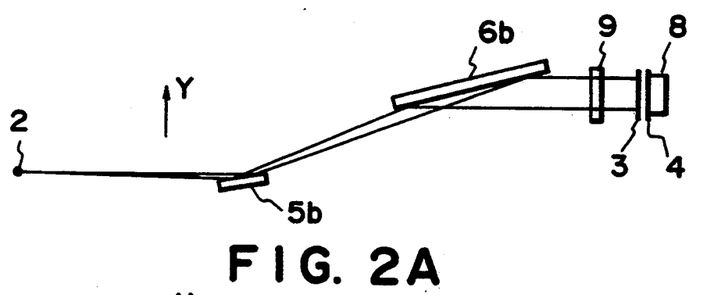
Figure 2B:
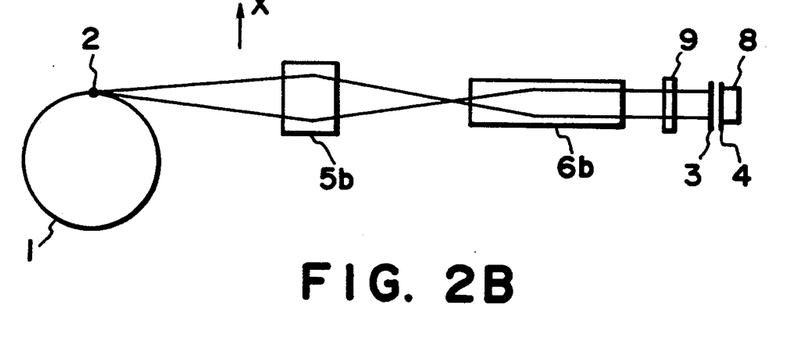

FIGS. 2A and 2B show the second embodiment of the present invention, wherein like numerals as those in FIGS. 1A and 1B denote corresponding elements.

This embodiment differs from the first embodiment in that: first mirror 5b has a toroidal shape of curvature, concave both in the X and Y directions, while second mirror 6b has a toroidal shape of curvature, concave in the X direction and convex in the Y direction.

Table 2 below shows specifications of the first and second mirrors.

TABLE 2

| MIRROR | X DIRECTION | | Y DIRECTION | |
|---|---|---|---|---|
| | RADIUS OF CURVATURE | FOCAL LENGTH | RADIUS OF CURVATURE | FOCAL LENGTH |
| 1ST | 0.101 | 1.923 | 17.34 | 0.227 |
| 2ND | 0.098 | 1.875 | 363.8 | 4.762 |

Unit:meter (Primary Incidence Angle: 88.5 deg.)

In Table 2, the distance from the emission point to the first mirror 5b is 5 m; the distance from the first mirror 5b to the second mirror 6b is 5 m; and the primary incidence angle of the light to the mirror is 88.5 deg., in both cases of the first and second mirrors 5b and 6b. The synthetic focal length is 3 m in the X direction and 100 m in the Y direction.

If the size of the exposure region on the mask is 20 mm square, the angle of acceptance of synchrotron radiation light is 0.38 deg. in the X direction and 0.011 deg. in the Y direction. Namely, in the X direction the light collection is 33 times as much as in the Y direction. As a consequence, the illuminance on the mask increases considerably.

The reflectivity to the X-rays largely depends on the angle of incidence. In an ordinary reflecting mirror using metal or the like, a high reflectivity is attainable provided that the angle of incidence is slightly smaller than 90 deg. If the angle of incidence becomes small, the reflectivity decreases largely. Accordingly, the light has to be projected with an angle of grazing incidence. If a curved surface mirror is used with grazing light incidence and when the radius of curvature of the mirror is R and the angle of incidence is $\theta$, then the focal length F in a plane defined by a straight line parallel to the projected light and the projection thereof onto the tangential plane to the mirror surface is given by:

$$F = (R \times \cos\theta)/2.$$

On the other hand, in a plane perpendicular to that plane and containing a straight line parallel to the projected light, the focal length F is given by:

$$F = R/(2 \times \cos\theta).$$

Also, if plural reflecting mirrors are used and when the focal length of a first mirror (5b) is F1 while the focal length of a second mirror (6b) is F2 and the distance from the first mirror to the second mirror is L, then the synthetic focal length FO of this system is given by:

$$FO = (F1 \times F2)/(F1 + F2 - L).$$

On the basis of these relations, it is possible to design a collimating optical system with different synthetic focal lengths in the X and Y directions while using plural grazing incidence reflecting mirrors, as in the first and second embodiments.

Figure 3A:
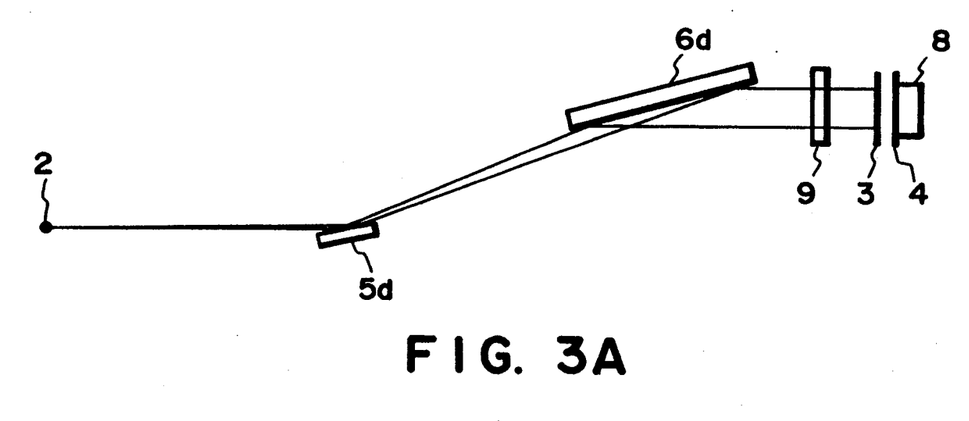
Figure 3B:
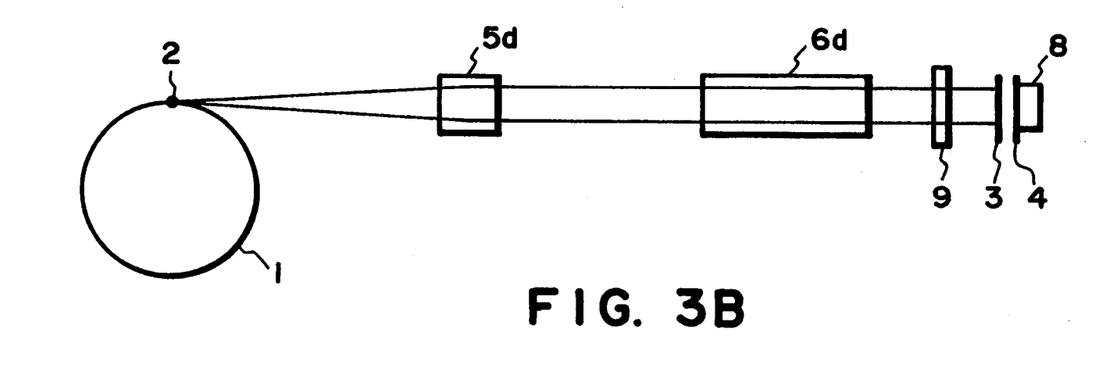

Referring to FIGS. 3A and 3B showing the third embodiment, like numerals as those in FIG. 1A and 1B are assigned to corresponding elements.

In this embodiment, a first reflecting mirror 5d has a toroidal shape of curvature, concave in the X direction and convex in the Y direction. Second reflecting mirror 6d has a cylindrical shape of curvature, infinite in the X direction and concave in the Y direction. Since the light is collected by the first reflecting mirror 5d in the X direction, the radiation light can be accepted with a large angle.

Table 3 shows specifications of the mirrors of this embodiment.

TABLE 3

| MIRROR | X DIRECTION | | Y DIRECTION | |
|---|---|---|---|---|
| | RADIUS OF CURVATURE | FOCAL LENGTH | RADIUS OF CURVATURE | FOCAL LENGTH |
| 1ST | 0.419 | 3.0 | −2.75 | −0.096 |
| 2ND | INFINITE | INFINITE | 88.6 | 3.09 |

Unit:meter (Primary Incidence Angle: 86 deg.)

Here, the distance from the emission point to the first mirror is 3 m; the distance from the first mirror to the second mirror is 3 m; and the primary incidence angle of the light to the mirror is 86 deg., in both cases of the first and second mirrors. The synthetic focal length is 3 m in the X direction and 100 m in the Y direction.

In this embodiment, each of the mirrors 5d and 6d has formed thereon a multilayered film. More specifically, 5 tungsten and carbon materials are accumulated alternately (each five layers) to provide a multilayered film. In an ordinary reflecting mirror using metal or the like, a high X-ray reflectivity is attainable provided that the angle of incidence (angle with respect to a normal) is about 90 deg. However, with a decreasing incidence angle, the reflectivity reduces largely. To the contrary, if a multilayered film is provided on the surface of a reflecting mirror, it becomes possible to obtain a high reflectivity even with a small angle of incidence.

Figure 4A:
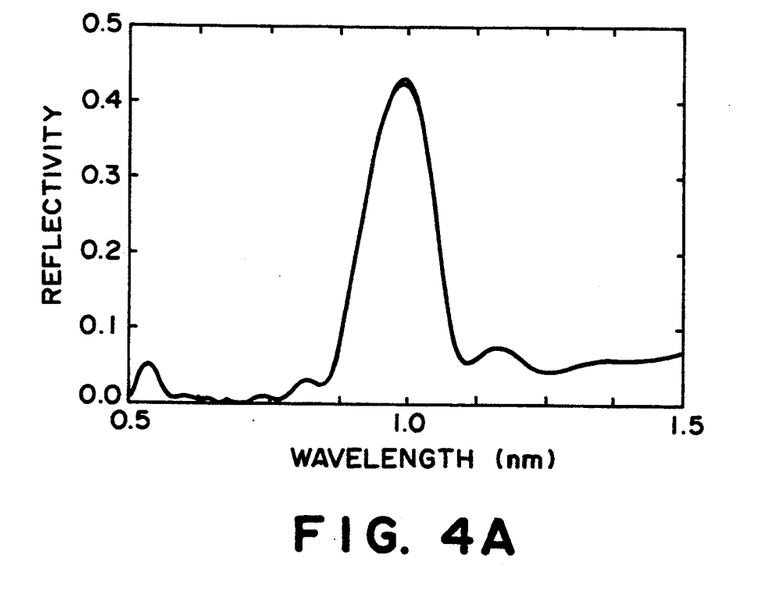
FIG. 4A is a graph showing the wavelength vs. reflectivity characteristic of a multilayered film reflecting mirror.
Figure 4B:
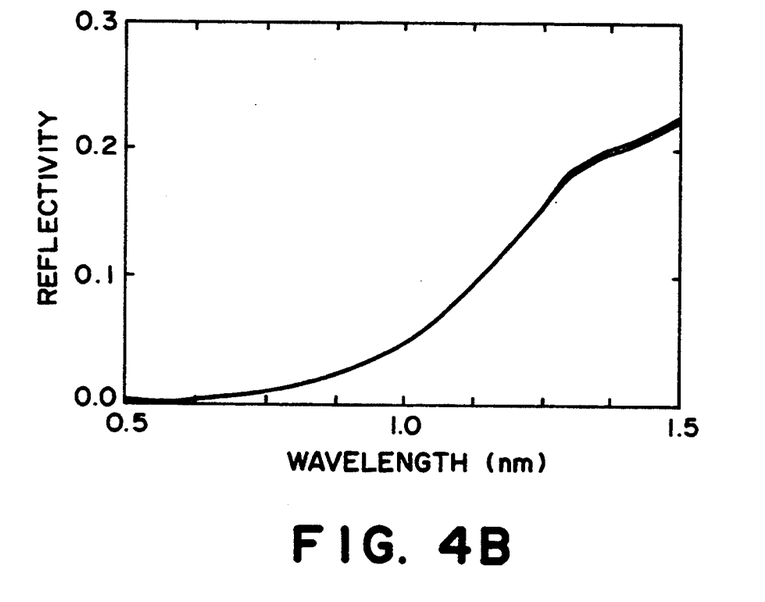
FIG. 4B is a graph showing the wavelength vs. reflectivity characteristic of a single-layer film reflecting mirror.

FIGS. 4A and 4B are graphs each showing the wavelength vs. reflectivity characteristic of a reflector where the angle of incidence to the reflector is 86 deg. FIG. 4A corresponds to a multilayered film mirror according to this embodiment wherein tungsten and carbon materials are accumulated alternately (each five layers). FIG. 4B corresponds to a reflecting mirror with a single gold layer. It is seen that the reflecting mirror of this embodiment assures a high reflectivity, as compared with the reflecting mirror of a single gold film.

Using a multilayered film reflecting mirror in an exposure apparatus assures the following advantages:

(1) The angle of incidence of X-rays can be made small and, therefore, it is possible to use a small size reflecting mirror for illuminating the exposure region. This facilitates reduction in size and cost of the exposure apparatus.

(2) Since the angle of incidence of X-rays can be small, the surface precision of the reflecting mirror becomes less influential. This leads to improved parallelism of illuminating light and, thus, to improved precision of the exposure apparatus.

Figure 5:
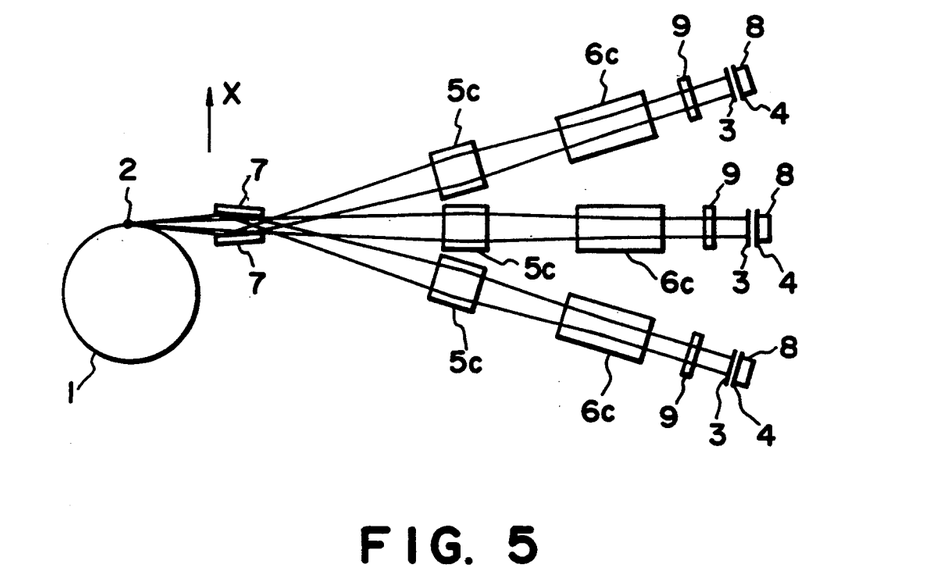
FIG. 5 is a plan view of a fourth embodiment of the present invention.

Referring to FIG. 5 showing the fourth embodiment of the present invention, like numerals as those of FIGS. 1A and 1B are assigned to corresponding elements.

Two flat reflecting mirrors 7—7 are provided to divide synchrotron radiation light into three beams. For each of the three divided beams, there are provided two mirrors 5c and 6c so as to collect and collimate the corresponding beam. The three radiation beams each being collected and collimated are directed to three exposure units, respectively, for executing mask pattern transferring operations in these units, respectively. Each mirror 5c or 6c is of the same structure as that described above with reference to one of the first to third embodiments of the present invention.

In an arrangement according to this embodiment, a plurality of exposure units can operate simultaneously in conjunction with a single port and, therefore, the efficiency of utilization of synchrotron radiation light is high. Also, the area of floor necessary for the exposure apparatus as a whole can be made small.

The present invention is not limited to the forms of the embodiments described above. Any combination of mirrors may be used to collect light in the X and Y directions, provided that the absolute value of its synthetic focal length in the X direction is smaller than that in the Y direction.

With the above-described structure of the present invention, various advantageous effects are obtainable. Examples are as follows:

(a) A mask can be illuminated with substantially collimated (parallel) synchrotron radiation light. Thus, it is possible to avoid or reduce the run-out error. This assures improved positional precision of a transferred pattern.

(b) Since the synchrotron radiation light can be accepted efficiently, the strength of illumination is high. This effectively reduces the exposure time and increases the throughput of the exposure apparatus.

It is to be noted that the present invention is not limited to an exposure apparatus. The invention is applicable also to an X-ray microscope, an optical CVD apparatus, or an optical etching apparatus, for example.

Figure 6:
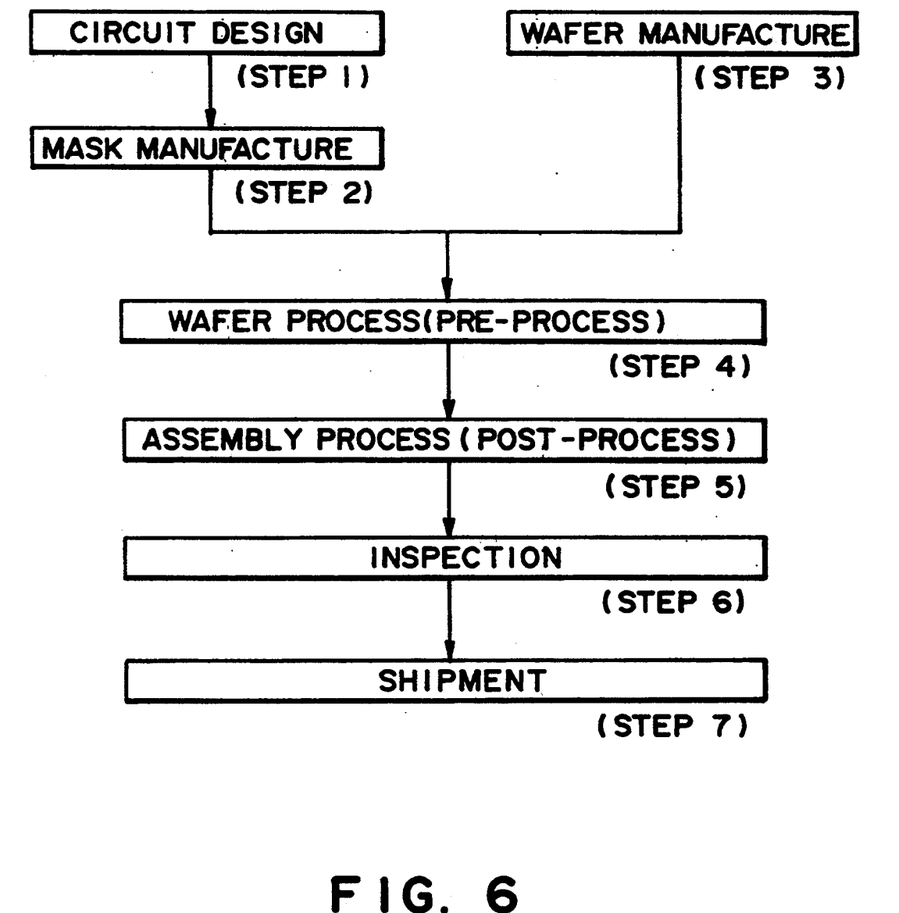
FIG. 6 is a flow chart of the semiconductor device manufacturing processes.
Figure 7:
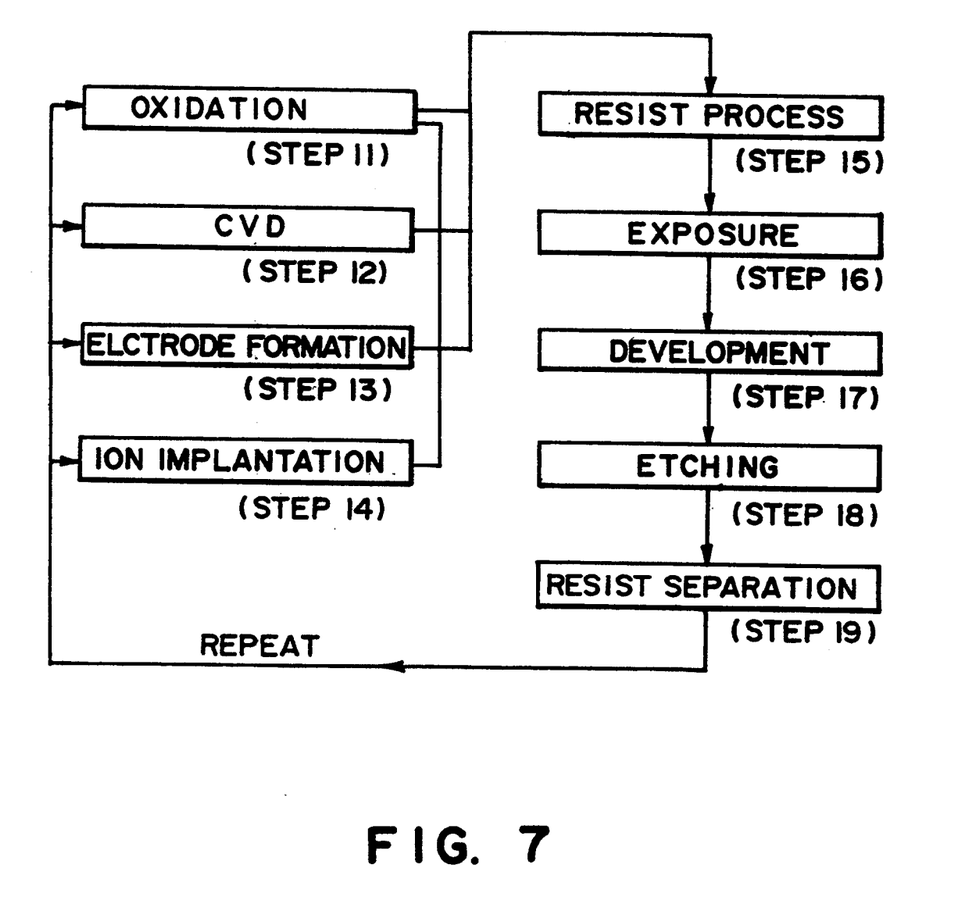
FIG. 7 is a flow chart showing details of a wafer process.

Referring now to FIGS. 6 and 7, description will be made of a semiconductor device manufacturing method according to an embodiment of the present invention, which uses one of the exposure apparatuses of the first and fourth embodiments.

FIG. 6 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

FIG. 7 is a flow chart showing details of the wafer process. Step 11 is an oxidation process for oxidizing the surface of a wafer. Step. 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

The semiconductor device manufacturing method of this embodiment uses the optical arrangement described with reference to any one of the first to fourth embodiments of the present invention described hereinbefore. It is therefore possible to produce semiconductor devices of higher degree of integration.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing method comprising:
   transforming a synchrotron radiation beam emitted from an emission point of a synchrotron ring into a substantially parallel beam, with respect to a first direction, which is parallel to an orbit plane of the synchrotron ring and with respect to a second direction, which is perpendicular to the orbit plane, by using an optical system including a first mirror of toroidal shape and a second mirror of cylindrical shape; and
   projecting the obtained parallel radiation beam to a mask having a circuit pattern to transfer the circuit pattern of the mask to a wafer.

2. A semiconductor device manufactured by a method, which comprises:
   transforming a synchrotron radiation beam emitted from an emission point of a synchrotron ring into a substantially parallel beam, with respect to a first direction, which is parallel to an orbit plane of the synchrotron ring and with respect to a second direction, which is perpendicular to the orbit plane, by using an optical system including a first mirror of toroidal shape and a second mirror of cylindrical shape; and
   projecting the obtained parallel radiation beam to a mask having a circuit pattern to transfer the circuit pattern of the mask to a wafer.

3. An optical arrangement comprising:
   an optical system including a first mirror of toroidal shape and a second mirror of cylindrical shape, for transforming synchrotron radiation light emitted from an emission point of a synchrotron ring into a substantially parallel beam, with respect to a first direction, which is parallel to an orbit plane of the synchrotron ring and with respect to a second direction, which is perpendicular to the orbit plane,
   wherein an absolute value of a focal length of said optical system in the first direction is smaller than that in the second direction.

4. An optical arrangement according to claim 3, wherein said first mirror has a curvature concave in the first direction and convex in the second direction and said second mirror has a curvature infinite in the first direction and concave in the second direction [for collecting the synchrotron radiation light in the second direction.

5. An optical arrangement according to claim 3, wherein said optical system comprises a reflecting mirror having a reflecting surface provided by a single-layer film.

6. An optical arrangement according to claim 3, wherein said optical system comprises a reflecting mirror having a reflecting surface provided by a multilayered film.

7. A synchrotron orbit radiation exposure apparatus usable with a synchrotron ring, for transferring a pattern of an original onto a substrate, said apparatus comprising:
   means for holding the original and the substrate in a predetermined positional relationship; and
   an illumination system for providing a radiation beam for transferring the pattern of the original onto the substrate, said illumination system comprising an optical system including a first mirror of toroidal shape and a second mirror of cylindrical shape, for transforming synchrotron radiation light emitted from an emission point of the synchrotron ring into a substantially parallel beam, with respect to a first direction, which is parallel to an orbit plane of the synchrotron ring and with respect to a second direction, which is perpendicular to the orbit plane,
   wherein an absolute value of a focal length of said optical system in the first direction is smaller than that in the second direction.

8. An apparatus according to claim 7, further comprising an exposure adjusting mechanism for adjusting the amount of exposure for the pattern transfer.

9. An apparatus according to claim 7, further comprising a position adjusting mechanism for adjusting the relative positional relationship between the original and the substrate.

10. A synchrotron orbit radiation exposure system, comprising:
   a synchrotron ring; and
   a plurality of exposure apparatuses each comprising (i) means for holding an original and a substrate in a predetermined positional relationship, and (ii) an illumination system for providing a radiation beam for transferring a pattern of the original onto the substrate, said illumination system comprising an optical system including a first mirror of toroidal shape and a second mirror of cylindrical shape, for transforming synchrotron radiation light emitted from an emission point of the synchrotron ring into a substantially parallel beam, with respect to a first direction, which is parallel to an orbit plane of the synchrotron ring and with respect to a second direction, which is perpendicular to the orbit plane,
   wherein an absolute value of a focal length of said optical system in the first direction is smaller than that in the second direction.

* * * * *

UNITED STATES PATENT AND TRADEMARK OFFICE
CERTIFICATE OF CORRECTION

PATENT NO. : 5,394,451
DATED : February 28, 1995
INVENTOR(S) : AKIRA MIYAKE, ET AL.

It is certified that error appears in the above-indentified patent and that said Letters Patent is hereby corrected as shown below:

<u>COLUMN 1</u>

Line 5, "INVENTIONS" should read --INVENTION--.

<u>COLUMN 7</u>

Line 46, "direction [for col-" should read
--direction.--; and
    Lines 47 and 48, should be deleted in their entirety.

Signed and Sealed this

Thirteenth Day of June, 1995

Attest:

BRUCE LEHMAN

*Attesting Officer*      *Commissioner of Patents and Trademarks*